United States Patent

Collot et al.

[11] Patent Number: 5,200,357
[45] Date of Patent: Apr. 6, 1993

[54] METHOD FOR THE SELF-ALIGNMENT OF METAL CONTACTS ON A SEMICONDUCTOR DEVICE, AND SELF-ALIGNED SEMICONDUCTORS

[75] Inventors: Philippe Collot, Orsay; Paul Schmidt, Bourg la Reine, both of France

[73] Assignee: Thomson-CSF, Puteaux, France

[21] Appl. No.: 711,070

[22] Filed: Jun. 6, 1991

[30] Foreign Application Priority Data

Jun. 12, 1990 [FR] France .................. 90 07282

[51] Int. Cl.⁵ .......................................... H01L 21/44
[52] U.S. Cl. ........................................ 437/180; 437/41; 437/187; 437/184; 148/DIG. 140
[58] Field of Search ............... 437/180, 41, 44, 29, 437/187, 184; 148/DIG. 140

[56] References Cited

U.S. PATENT DOCUMENTS

| | | | |
|---|---|---|---|
| 4,587,710 | 5/1986 | Tsao | 148/DIG. 140 |
| 4,735,680 | 4/1988 | Yen | 437/41 |
| 4,886,765 | 12/1989 | Chen et al. | 437/44 |
| 4,908,326 | 3/1990 | Ma et al. | 437/41 |
| 4,925,807 | 5/1990 | Yoshikawa | 437/41 |
| 5,015,598 | 5/1991 | Verhaar | 437/41 |
| 5,015,599 | 5/1991 | Verhaar | 437/41 |

FOREIGN PATENT DOCUMENTS

| | | | |
|---|---|---|---|
| 0111706 | 6/1984 | European Pat. Off. | 437/29 |
| 0257231 | 10/1988 | Japan | 437/44 |

OTHER PUBLICATIONS

IBM Technical Disclosure Bulletin, vol. 26, No. 7b. Dec., 1983, pp. 3842-3844. H. H. Chao, et al., "Stepped Oxide Spacer Process for Self-Aligned Silicide Without Bridging".

*Primary Examiner*—Brian E. Hearn
*Assistant Examiner*—Michael Trinh
*Attorney, Agent, or Firm*—Oblon, Spivak, McClelland, Maier & Neustadt

[57] ABSTRACT

Disclosed is a method for making self-aligned metal contacts on semiconductor devices, with a submicronic spacing between regions controlled by the contacts. On a semiconductor body supporting at least one raised pattern, a double layer of $SiO_2$ and $Si_3N_4$ is deposited by an isotropic method. A double ionic etching of $Si_3N_4$ by $SF_6$ and of $SiO_2$ by $CHF_3$ is done to insulate the sidewalls on the flanks of the pattern. A sub-etching by $HF/NH_4F/H_2O$ creates a cap beneath each sidewall. The metal contacts, deposited by evaporation, are self-aligned and separated by a space "d" equal to the thickness of the insulating layers.

4 Claims, 1 Drawing Sheet

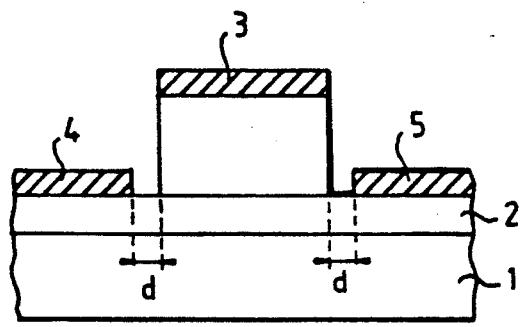
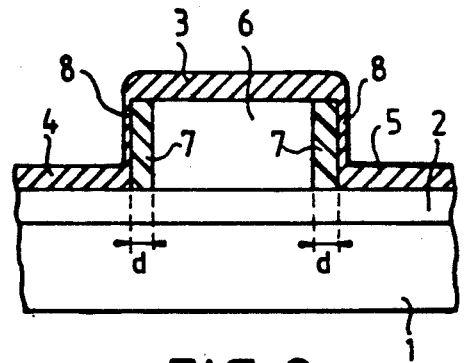
FIG.1 PRIOR ART    FIG.2
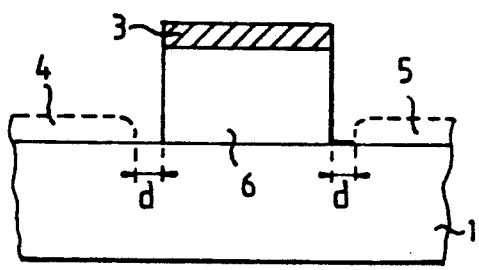
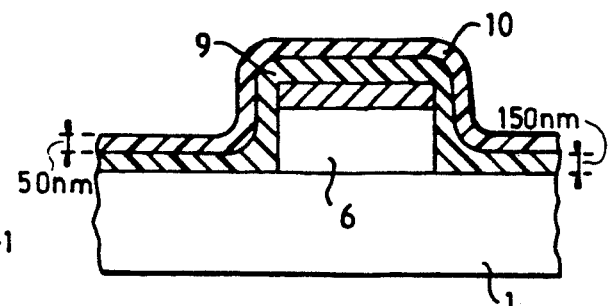
FIG.3    FIG.4
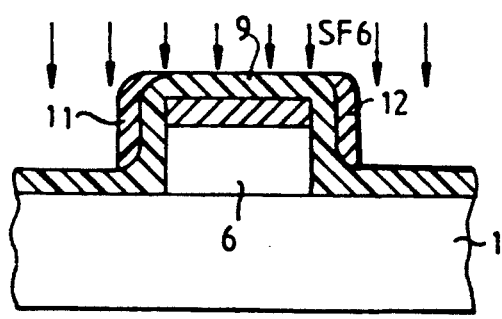
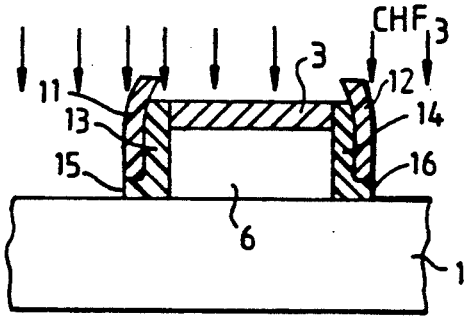
FIG.5    FIG.6
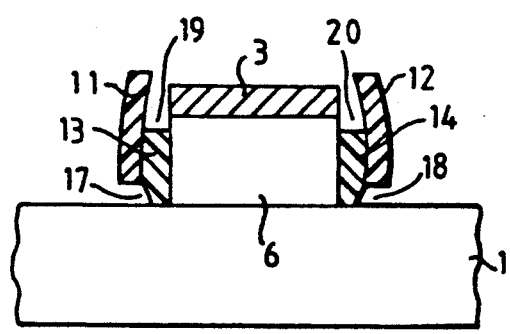
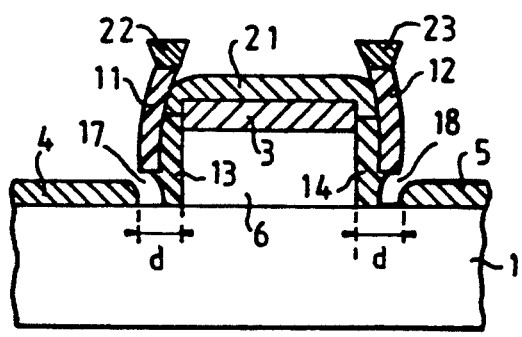
FIG.7    FIG.8

METHOD FOR THE SELF-ALIGNMENT OF METAL CONTACTS ON A SEMICONDUCTOR DEVICE, AND SELF-ALIGNED SEMICONDUCTORS

BACKGROUND OF THE INVENTION

1. Field of the Invention

The present invention relates to a method for the self-alignment of metal contacts on semiconductors, wherein a sidewall is used to reserve a submicronic distance between two neighboring regions controlled by two metallizations. The invention can be applied to semiconductor devices such as transistors and, more specifically, to those working in microwave applications where the safety distances between neighboring regions are sometimes submicronic.

2. Description of the Prior Art

It is known that, in a transistor such as the one shown schematically in FIG. 1, comprising at least one substrate 1, one active layer 2, one control region 3 with its metallization and two access electrodes 4 and 5, it is important to reduce the distances referenced "d" between two neighboring regions. In the particular example shown, if the transistor is a field-effect transistor, it is important, for several reasons, to reduce the distance "d" between the source 4 and the gate 3 and the distance "d" between the gate 3 and the drain 5.

The distance "d" considered in the active layer 2, determines the values of resistance to access from the source region 4 and drain region 5 to the region controlled by the gate 3 in the active layer 2, and these access resistance values come into play in the characteristics of the transistors. The access resistance values will therefore be minimal, and the characteristics of the transistors will be improved if the distances "d" are reduced without, however, being cancelled for it is these distances that govern the voltage strength of a transistor. An optimum value would be of the order of 100 nm, namely 0.1 micrometer.

The method used should, however, retain the possibility making additional coatings, to the metallizations of the electrodes, of AuGe/Ni/Au alloy which reduces the resistivity of the contacts.

However, it is also known that the presently used techniques are not entirely satisfactory, and that the development of microwave transistors or integrated circuits with very large-scale integration comes up against these problems of submicronic geometries.

The usual technique of UV photolithography, owing to its relative lack of precision in the alignment of the masks, leads to high, non-reproducible values of access resistance, and the distances "d" are rarely smaller than one micron (1000 nm).

In certain T gate or capped gate techniques, the access resistance is determined by a chemical sub-etching of the material of the gate region 3, beneath the metallization, but poor control of the sub-etching leads to non-reproducible access resistance values.

Finally, the sidewall technique has been adopted to self-align an ion implantation process. However, this technique entails a delicate step as shown in FIG. 2.

Briefly, the sidewall method consists in covering a pattern 6, in the form of a mesa on the surface of the semiconductor wafer 1+2, with a uniform layer of an insulator such as silica. By reactive ionic etching (RIE), this layer is eliminated except at 7, on the flanks of the pattern 6: the thickness of the layer 7 defines the distance "d" separating two neighboring regions in the active layer 2, with high precision, namely the precision obtained by the growth of a layer that can be efficiently controlled.

However, during the self-aligned deposition of the metallizations of the electrodes 3, 4 and 5, it often happens that a fine metal film 8 gets deposited on the flanks of the sidewall 7, entailing the risk of a short-circuit between electrodes. The removal of this residual metallization 8 by an inclined ionic machining of the flank of the "sidewall" is a delicate task, for there is a risk of its causing deterioration in the insulating properties of the sidewall 7, by surface conduction after irradiation.

SUMMARY OF THE INVENTION

The method according to the invention overcomes the above-mentioned drawbacks. It is an improvement in the standard "sidewall" technology. According to the invention, the sidewall is constituted by two superimposed layers made of two materials such as silica and silicon nitride, having highly different characteristics of solubility in a chemical etching solution. A sub-etching is done by the partial dissolving of the most soluble layer. This sub-etching guarantees the electrical insulation between the self-aligned contacts since the least soluble layer takes the form of a cap. By interrupting the residual metallization of the flank of the sidewall, this sub-etching enables the inclined ionic machining operation to be eliminated.

More precisely, the invention relates to a method for the self-alignment of the metal contacts on a semiconductor device comprising at least one raised pattern on a semiconductor body, said method comprising the following operations:

the depositing by an isotropic method, on the free surfaces of the body and of the pattern, including the lateral surfaces of this pattern, of a first insulating layer of silica $SiO_2$ and then a second insulating layer of silicon nitride $Si_3N_4$ with well-controlled thicknesses, the anisotropic, reactive ion etching, by $SF_6$, of the second layer in its parts deposited on the free face of the body and on top of the pattern, the portions of this layer deposited on the flanks of the pattern remaining unetched, the anisotropic, reactive ion etching, by $CHF_3$, of the first layer, with the exception of its portions deposited on the flanks of the pattern, which are masked by the corresponding portions of the second layer;

the selective and isotropic chemical etching, by a buffered solution of $HF/NH_4F/H_2O$, of the first layer, this etching operation creating a sub-etching in the portions of the first layer that are partially masked by the corresponding portions of the second layer not etched by said selective solution.

the self-aligned metallization, by a directional method, of the metal electrode contacts of the semiconductor device, the juxtaposed portions of the two insulator layers on the flanks of the pattern constituting sidewalls between the regions of the semiconductor device controlled by two neighboring metallizations.

BRIEF DESCRIPTION OF THE DRAWING

The invention will be understood more clearly from the following more detailed description of an exemplary embodiment, made with reference to the appended figures, of which:

FIGS. 1 and 2 show sectional views of a prior art semiconductor device, described here above, FIGS. 3 to 8 show different steps of the method for making sidewalls according to the invention.

MORE DETAILED DESCRIPTION

More precisely, the description of the invention shall be made with reference to the example of a field-effect transistor that can be made either of silicon or of fast materials of the III-V or II-VI type such as GaAs, GaAlAs etc. In the figures, the layers forming the body of this transistor as well as the raised pattern are not specified in detail, since the internal structure of the transistor is beyond the scope of the invention, which relates to the making of surface metallizations that are self-aligned and separated by submicronic safety distances.

The initial structure of the method, shown in FIG. 3, comprises a body 1 made of a semiconductor material (substrate, buffer layers, active layers etc.) on the surface of which there is a raised pattern 6. This pattern may be formed either by a mesa of semiconductor materials that have already received a thin layer metallization 3, for example WSiTi, or by a gate metallization which, however, in this case, is thickened by additional coating: it must have lateral walls. On this structure, it is sought to deposit self-aligned metallizations 4 and 5, separated from the pattern 6 by submicronic distances "d", for example 200 nm.

On this structure, as shown in FIG. 4, a first layer 9 of silica $SiO_2$ and a second layer 10 of silicon nitride $Si_3N_4$ are deposited by a method such as that of epitaxy by chemical vapor deposition (CVD). Epitaxy by CVD ensures evenness in the thickness of the layers, for it is isotropic, so that if the respective thicknesses of 150 nm and 50 nm, for example, of $SiO_2$ and $Si_3N_4$ are deposited on the horizontal surfaces of the structure, the same thickness recur on the flanks of the pattern 6. Epitaxy by CVD is a method that is sufficiently precise and slow for it to be possible to stop the deposition and to control the thicknesses to within a few electron shells. The total thickness of the two layers 9 and 10 is equal to the desired distance "d".

Those parts of the double insulator layer 9+10 that cover the locations of the future electrode metallizations 3, 4 and 5 have to be removed.

In FIG. 5, by means of a dry reactive ionic etching (RIE) using $SF_6$, only the horizontal parts of the layer 10 of $Si_3N_4$ are etched because this etching method is directional. The layer 9 of $SiO_2$ is undamaged and all that remains of the layer 10 of $Si_3N_4$ is the flanks 11 and 12 around the raised pattern 6, covered with $SiO_2$. The action of RIE by $SF_6$ is shown schematically in FIG. 5 by arrows.

This first etching by $SF_6$ etches only one of the two insulator layers: the zones where the metal contacts 3, 4 and 5 have to be deposited are still covered with a layer 9 of $SiO_2$. By means of a second dry reactive ionic etching, using $CHF_3$, shown in FIG. 6, the horizontal parts of the layer 9 of $SiO_2$ are etched, and all that remains of this layer is the flanks 13 and 14, which adhere around the raised pattern 6, because they are protected by the flanks 11 and 12, and because RIE is directional and selective. The sandwich $SiO_2+Si_3N_4$, 11+13 or 12+14 defines the sidewalls.

However, the external side surface of these insulating spacers is relatively plane, i.e., by the directional action of the RIE, the surfaces 15 and 16 of the silica layers 13 and 14, in the vicinity of the semiconductor body 1, are etched in the extension of the external surfaces of the layers 11 and 12 of $Si_3N_4$. It follows that if a metallization were to be made on such a structure, the drawback of the standard sidewall, indicated in FIG. 2, would reappear: residual metallizations on the flanks would cause source-gate and gate-drain short-circuits, or else they would necessitate an inclined ionic etching.

The following operation, shown in FIG. 7, will therefore introduce a sub-etching, or cap profile, at the base of the sidewalls. This sub-etching is done by a wet process, using a standard buffered solution of $HF/NH_4F/H_2O$, known as BOE. It has the advantage of displaying high selectivity, and etches $SiO_2$ about twenty times faster than $SI_3N_4$. The etching speed of $SiO_2$ is about 100 nanometers per minute, at an ambient temperature of 15°-20° C. The flanks 11 and 12 of $Si_3N_4$ serve as etching masks and, in 15 seconds of etching, the flanks 13 and 14 of $SiO_2$ are etched to a depth of about 25 nanometers at 17 and 18, at the base of the sidewalls, and also at 19 and 20 at the top of the raised pattern 6.

The structure is thereafter adapted for self-aligned metallizations. In FIG. 8, a directional evaporation of metals simultaneously deposits the thin layers for the access electrodes 4 and 5 and for the control electrode for the raised pattern 6 (layer referenced 21). It must be observed that if the control electrode is of the Schottky type, it is preferable to make it at the very first step, shown in FIG. 3. The metallization of FIG. 8 is of the ohmic type. The additional coating of the gate contact 3 with the layer 21 provides for a appreciable diminishing of the electric gate resistance. Accessorily, the $Si_3N_4$ sidewalls 11 are capped by a metallization 22-23.

In the finished structure, the regions controlled by the self-aligned metallizations 3, 4 and 5 are separated by submicronic distances "d", equal to the thickness of the sidewalls 11+13 and 12+14, and the sub-etchings at 17 and 18 prevent residual metallizations on the flanks of the sidewalls.

What is claimed is:

1. A method for self-alignment of metal electron contacts on a semiconductor device comprising at least one raised pattern on a semiconductor body, said method comprising the following operations:

depositing by an isotropic method, on free surfaces of the body and of the pattern, including a lateral surface and flanks of said pattern, of a first insulating layer of silica $SiO_2$ and then a second insulating layer of silicon nitride $Si_3N_4$ with well-controlled thicknesses, anisotropic, reactive ion etching, by $SF_6$, of the second layer in its parts deposited on the free surfaces of the body and on top of the pattern, portions of said second layer deposited on the flanks of the pattern remaining unetched, anisotropic, reactive ion etching, by $CHF_3$, of the first layer, with the exception of its portions deposited on the flanks of the pattern, which are masked by the corresponding portions of the second layer;

selective and isotropic chemical etching, by a buffered solution of $HF/NH_4F/H_2O$, of the first layer, this etching operation creating a sub-etching in the portions of the first layer that are partially masked by the corresponding portions of the second layer not etched by said selective solution, self-aligned metallization, by a directional method, of the metal electrode contacts of the semiconductor device, the juxtaposed portions of the first and second insulating layers on the flanks of the pattern constituting sidewalls between regions of the semiconductor device controlled by two neighboring metallizations.

2. A method according to claim 1 wherein the first and second insulating layers have a submicronic total thickness and the sidewalls have a thickness "d" which is submicronic.

3. A method according to claim 1, wherein at least one thin-layer metallization is provided as an additional coating of metal in order to finish its electrical resistance.

4. A method for self-alignment of metal electrode contacts on a semiconductor device wherein one of said contacts is a Schottky type gate and said semiconductor device includes at least one raised pattern on a semiconductor body, said method comprising the steps of:

metaling said Schottky type gate contact;

depositing by an isotropic method, on free surfaces of the body and of the pattern, including a lateral surface and flanks of said pattern, of a first insulating layer of silica $SiO_2$ and subsequently a second insulating layer of silicon nitride $Si_3N_4$ with well-controlled thicknesses;

anisotropic, reactive ion etching, by $SF_6$, of the second layer and its parts deposited on the free surfaces of the body and on top of the pattern, portions of said layer deposited on the flanks of the pattern remaining unetched;

anisotropic, reactive ion etching, by $CHF_3$,f of the first layer, with the exception of its portion deposited on the flanks of the pattern, which are masked by the corresponding portions of the second layer;

selective and isotropic chemical etching, by buffered solution of $HF/NH_4F/H_2O$, of the first layer, said etching operation creating a sub-etching in the portions of the first layer that are partially masked by the corresponding portions of the second layer not etched by said selective solution;

self-aligned metallization, by a directional method, of the metal electrode contacts not including said Schottky type contact, of the semiconductor device, the juxtaposed portions of the first and second insulating layers on the flanks of the pattern constituting side walls between regions of the semiconductor device controlled by two neighboring metallizations.

* * * * *